US006787858B2

(12) United States Patent
Zitouni et al.

(10) Patent No.: US 6,787,858 B2
(45) Date of Patent: Sep. 7, 2004

(54) CARRIER INJECTION PROTECTION STRUCTURE

(75) Inventors: Moaniss Zitouni, Gilbert, AZ (US); Edouard D. de Frésart, Tempe, AZ (US); Richard J. De Souza, Tempe, AZ (US); Xin Lin, Phoenix, AZ (US); Jennifer H. Morrison, Chandler, AZ (US); Patrice Parris, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/272,336

(22) Filed: Oct. 16, 2002

(65) Prior Publication Data

US 2004/0075144 A1 Apr. 22, 2004

(51) Int. Cl.[7] ........................ H01L 29/94; H01L 31/113
(52) U.S. Cl. ...................... 257/372; 257/376; 257/373
(58) Field of Search ............................. 257/373, 376, 257/372, 341, 204, 369

(56) References Cited

U.S. PATENT DOCUMENTS

| | | | |
|---|---|---|---|
| 4,862,233 A | * | 8/1989 | Matsushita et al. .......... 257/328 |
| 5,021,860 A | | 6/1991 | Bertotti et al. ................. 357/48 |
| 5,514,901 A | | 5/1996 | Peppiette et al. ............ 257/547 |
| 5,545,917 A | | 8/1996 | Peppiette et al. ............ 257/547 |
| 5,726,478 A | * | 3/1998 | Gantioler et al. ............ 257/355 |
| 5,969,391 A | * | 10/1999 | Tajima ........................ 257/373 |

OTHER PUBLICATIONS

Gupta et al., "Unbiased Guard Ring for Latchup–Resistant, Junction–Isolated Smart–Power ICs," IEEE BCTM, pp. 188–191 (2001).

Chan et al., "An Effective Cross–Talk Isolation Structure for Power IC Applications," IEEE, IEDM 95–971, pp. 38.4.1–38.4.4 (1995).

* cited by examiner

Primary Examiner—Eddie Lee
Assistant Examiner—Douglas W. Owens

(57) ABSTRACT

A structure protects CMOS logic from substrate minority carrier injection caused by the inductive switching of a power device. A single Integrated Circuit (IC) supports one or more power MOSFETs and one or more arrays of CMOS logic. A highly doped ring is formed between the drain of the power MOSFET and the CMOS logic array to provide a low resistance path to ground for the injected minority carriers. Under the CMOS logic is a highly doped buried layer to form a region of high recombination for the injected minority carriers. One or more CMOS devices are formed above the buried layer. The substrate is a resistive and the injected current is attenuated. The well in which the CMOS devices rest forms a low resistance ground plane for the injected minority carriers.

13 Claims, 2 Drawing Sheets

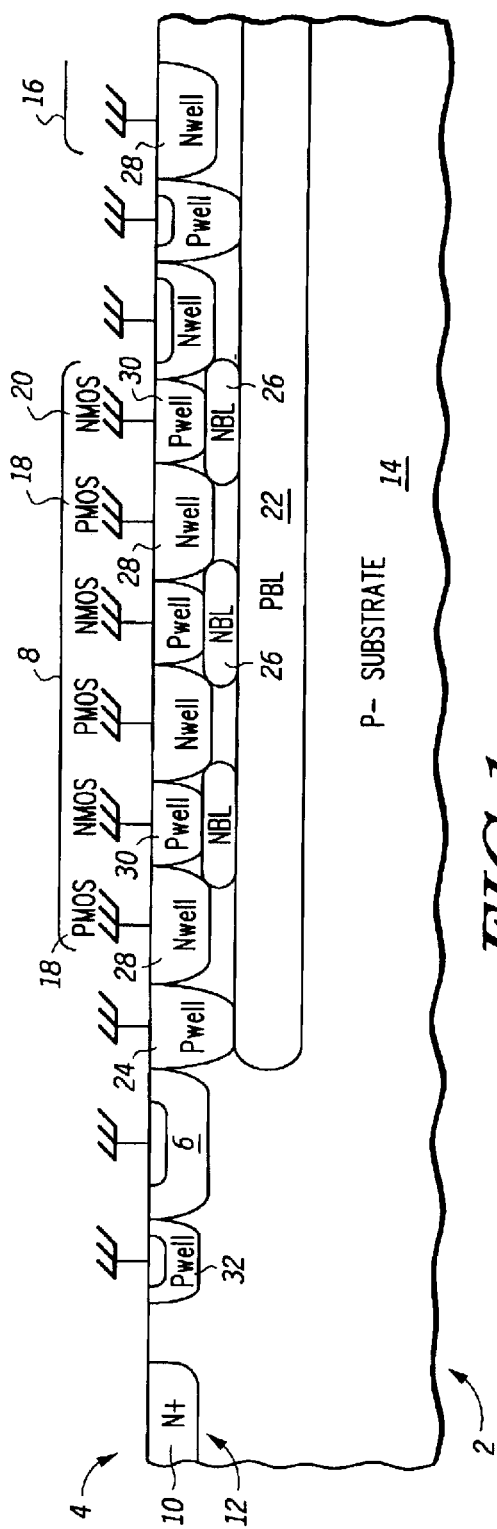
*FIG.1*
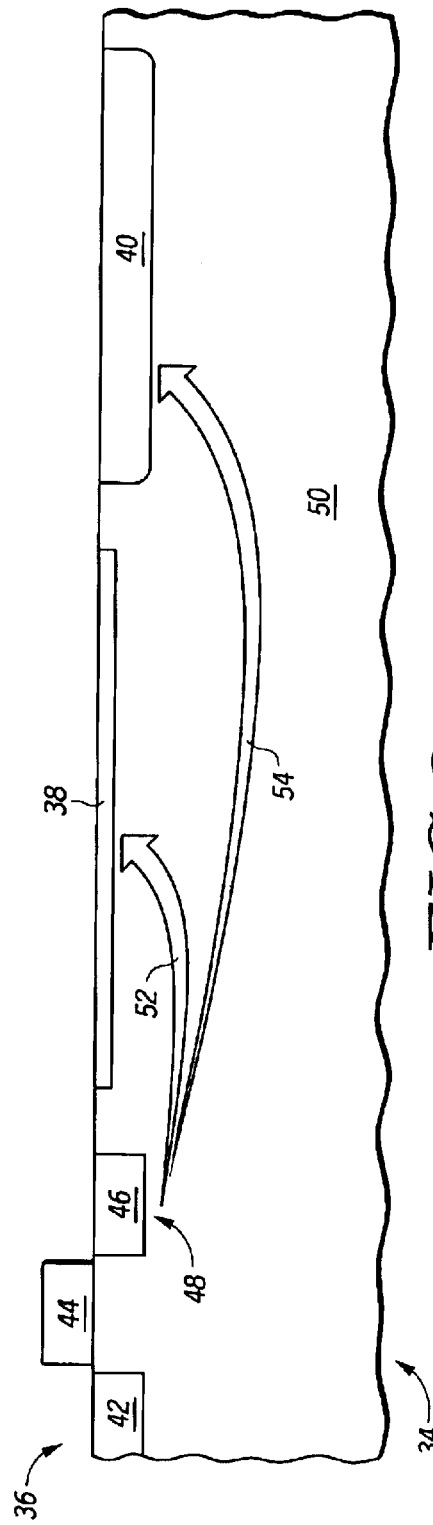
*FIG.2* —PRIOR ART—

CARRIER INJECTION PROTECTION STRUCTURE

FIELD OF THE INVENTION

The present invention relates to the field of integrated circuits, and more particularly to structures that protect CMOS logic from substrate carrier injection caused by the inductive switching of a power device.

BACKGROUND OF THE INVENTION

The quest for increased profits and product performance is driving the electronics industry to seek more cost effective methods of fabricating electronic devices. One method of reducing cost is through integrating a variety of electronic devices onto a single semiconductor chip. In the past, electronic systems were created using discrete electronic circuits supported by a Printed Circuit Board (PCB). It is possible to fabricate these PCB based systems having discrete electronic circuits and devices onto a single Integrated Circuit (IC). Through reducing the number of discrete electronic components in an electronic system with an IC, it is possible to greatly reduce the cost of electronic systems. Replacing PCB based electronic systems has numerous other advantages besides cost. These other advantages include reductions in size, reductions in power consumption, and increases in reliability and device speed.

The integration and fabrication of electronic systems having a diverse array of devices onto a single IC presents several problems. In a perfect IC, all of the devices on the IC would only communicate and interact with each other through the interconnect wires fabricated on the IC. However, in reality, all of the devices on the IC are able to communicate and interact with each other through means other than the interconnect wires. When electronic systems are fabricated on a single IC, the IC substrate electrically couples all the devices in the electronic system together. The substrate electrically acts as a resistor that interconnects all of the devices fabricated on the IC. As a result, the various devices supported on the IC are able to interact with each other through the substrate.

Commonly, an IC will support both CMOS logic and one or more power MOSFET transistors. In this electronic system, the CMOS logic is used to control the operation of the power MOSFET, which operates an external device. These types of circuits are commonly used in automotive applications. Examples of external devices operated by the power MOSFET include power car windows, air bag deployments, dash board gauges, and various car light bulbs.

The interaction of the various devices supported on a single IC creates a carrier injection problem. As noted above, these ICs having power MOSFETs and CMOS arrays are connected to external devices. These external devices can include inductive elements, the most basic of which is the car light bulb. When the power MOSFET driving the external device is in an ON mode, current flows through the power MOSFET on the IC to the external device. However, when the power MOSFET is switched OFF, the stoppage of current creates a back EMF in the inductive element of the external device. As a result, the back EMF causes a reverse current that places a negative bias across the drain of the power MOSFET and the substrate of the IC. Consequently, there is an injection of carriers into the substrate. This injection of carriers into the substrate causes significant problems within the IC.

To further specify the problem, the drain of the power MOSFET and the substrate form a PN junction, a simple diode. When the back EMF in the inductive element causes a reversal in current through the inductor, a negative bias is placed across the N portion of the PN diode placing the diode in a forward bias mode. This negative bias causes the PN junction to inject carriers into the IC substrate. The presence of these carriers injected into the substrate causes several problems for the devices on the IC.

One of these problems is device latch-up. Latch-up is a phenomena where digital CMOS circuits become "stuck" in a specific logic state. Simply stated, latch-up is caused by an internal feedback mechanism associated with parasitic PNPN-like action. In addition, latch-up also causes a regenerative current that can permanently damage CMOS devices. When integrating CMOS devices with power MOSFETS on an IC, latch-up avoidance is an important goal.

Another problem associated with the integration of various devices onto a single IC is potential threshold shifts in PMOS and NMOS devices due to the body effect. Shifts in threshold voltage are a significant problem for CMOS logic, and analog CMOS devices in particular.

One solution to this problem of substrate carrier injection caused by the inductive switching of a power device is to simply put enough space between the CMOS logic and the power MOSFET such that the injected current is attenuated by the resistivity of the substrate prior to reaching the CMOS array. Through putting enough chip space between the CMOS logic and the power MOSFET, the effect of the injected carriers on the CMOS logic is reduced to a manageable level. Spacings on the order of 500 um spacing between the CMOS logic and power MOSFET are necessary to implement this solution. The problem with this solution is that the spacing consumes a large amount of chip space, making it expensive and undesirable.

Electric circuits that consume large amounts of chip area are more expensive and less efficient than electric circuits that use a smaller amount of chip area. First, the less chip area used by a circuit enables the chip to support more circuits and functions. Also, the smaller the area occupied by the circuit enables the fabrication of smaller chips and more chips on a wafer. Through increasing the number of chips per wafer, the cost of each chip is reduced. Therefore, it is highly desirable to reduce the size of the combined power MOSFET and CMOS logic circuit on the IC in order to reduce the amount of chip space consumed to increase wafer profitability.

The reduction in scale of ICs to meet modern demands and economics has reduced the distance between the power MOSFET and the CMOS logic array from hundreds to tens of micrometers. This reduction in scale greatly increases the impact that injected carriers from inductive switching has on the CMOS logic performance. It is therefore necessary to develop technology that can facilitate the continued reduction in scale of IC circuits while compensating for the problem of injected carriers from inductive switching.

It is therefore highly desirable to develop a structure that can shield CMOS logic from carrier injection caused by inductive feedback. It is highly desirable to develop an injection protection structure that uses a minimal amount of chip space in order to maximize the capabilities of the chip and enhance the chip cost.

BRIEF DESCRIPTION OF THE DRAWINGS

FIG. 1 illustrates a preferred embodiment of the present invention.

FIG. 2 illustrates the flow of carriers in a prior art IC.

DETAILED DESCRIPTION OF A PREFERRED EMBODIMENT

Figure 3:
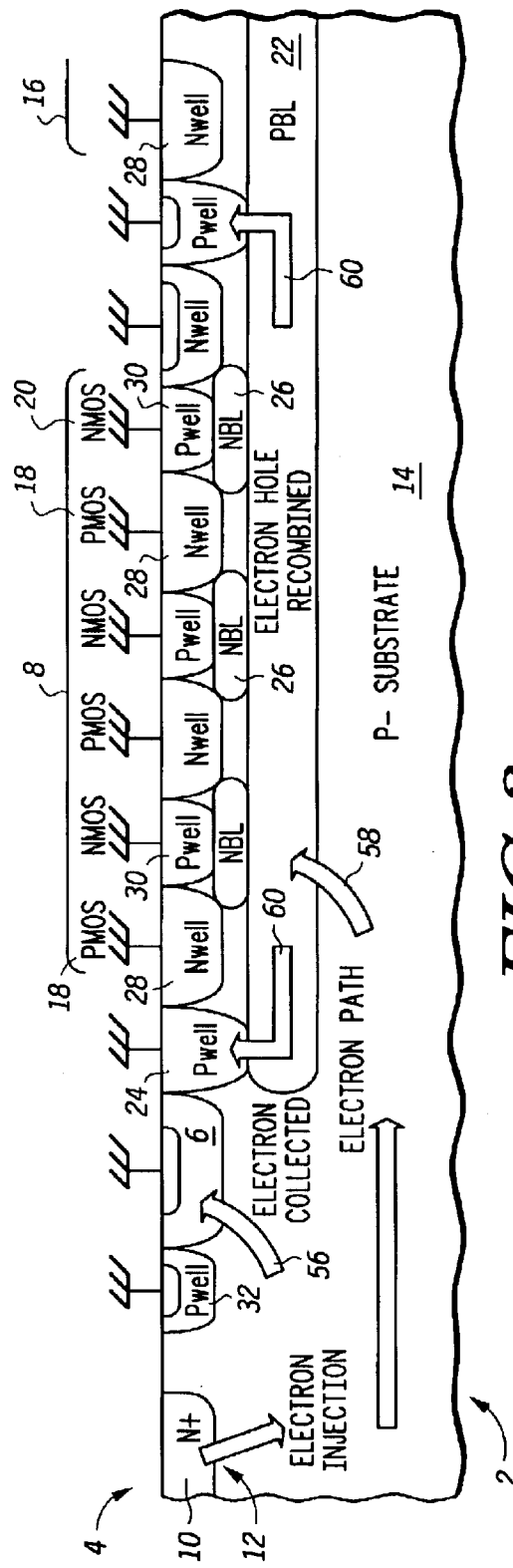
FIG. 3 illustrates a flow of carriers in a preferred embodiment of the present invention.

Referring to the Figures by characters of reference, FIG. 1 illustrates a preferred embodiment of the present invention. FIG. 1 illustrates an Integrated Circuit (IC) 2. On IC 2 is fabricated a power MOSFET (Metal Oxide Semiconductor Field Effect Transistor) 4, an N+ ring 6, and a CMOS logic array 8. Power MOSFET 4 is used to operate an external device not illustrated in FIG. 1. For example, in automotive operations, power MOSFET 4 could provide power to the car power windows, the deployment of the airbag system, the dashboard gauges, or even the interior car light.

The operation of power MOSFET 4 can be controlled by CMOS logic array 8. When CMOS logic array 8 determines when to turn power MOSFET 4 ON and OFF, it regulates the operation of the external devices like the interior car light, as an example. These external devices typically include inductive elements, like an incandescent light bulb. The equation for an inductive element is given below by Equation 1.

$$V = dI/dt * L \qquad \text{Equation (1):}$$

Referring to Equation 1, the voltage of an inductive element is given by the time rate of change of the current through the inductive element multiplied by the inductance of the inductive element. When CMOS logic array 8 switches power MOSFET 4 OFF, a back EMF (electromagnetic force) arises in the inductive element and causes a reversal in the current within the inductive element. As provided in Equation 1, a reversal in current from the back EMF causes dI/dt to become negative. As a result, the voltage across the inductive element is negative.

This negative voltage bias has a significant effect on the operation of IC 2. Referring again to FIG. 1, a drain 10 of power MOSFET 4 forms a PN junction diode 12 with P substrate 14. When the bias across diode 12 falls below ground, a burst of electrons is injected from diode 12 into substrate 14. When CMOS logic array 8 turns MOSFET 4 OFF and causes a back EMF in the inductive element, the arising negative voltage across the inductive element takes the bias of diode 12 below ground. Consequently, the switching of the inductive element by power MOSFET 4 below ground causes a burst of electron injection into substrate 14.

Other phenomena are known to cause bursts of electrons into substrate 14. One such phenomena is an Electro-Static Discharge (ESD). When a build up of static charge occurs within the electrical system connected with IC 2, the discharge of this static potential is known to cause bursts of electrons into substrate 14. In addition, a surge in power from a power supply coupled to IC 2 could also generate a burst of electrons into substrate 14. In short, the present invention addresses any transient that produces a burst of electrons into substrate 14 from diode 12.

This burst of electrons into substrate 14 presents a significant problem for CMOS logic array 8. These excess minority carriers in P substrate 14 can interfere with the operation of CMOS logic array 8. One way that these excess carriers in P substrate 14 interfere with the operation of CMOS logic array 8 is by causing latch-up. Latch-up is a phenomena where digital CMOS circuits become "stuck" in a specific logic state. In addition, latch-up also causes a regenerative current that can permanently damage CMOS devices. Simply stated, latch-up is caused by an internal feedback mechanism associated with parasitic PNPN-like action. When CMOS devices in array 8 become stuck in a specific logic state due to latch-up, CMOS array 8 can no longer operate properly.

A further problem caused by the presence of these excess carriers is that they can shift the threshold voltage in CMOS devices in array 8. The threshold voltage is the level of bias where the MOSFET turns ON and begins to conduct current. Shifts in threshold voltage can alter the operation of CMOS devices in array 8 from their normal operating parameters. These shifts in threshold voltage have a significant impact on the operation of analog CMOS array 16. Shifts in threshold voltage for analog CMOS devices can alter the entire response of an analog CMOS array 16, thereby preventing analog CMOS array 16 from operating within desired specifications. Note that both CMOS array 8 and 16 include PMOS devices 18 and NMOS devices 20.

The present invention provides a structure that addresses substrate 14 carrier injection from diode 12 caused by the inductive switching of a power MOSFET 4. The present invention functions to shield digital CMOS array 8 and analog CMOS array 16 from bursts of carrier injection from diode 12. P substrate 14 is resistive and consequently attenuates the propagation of carriers injected by diode 12. If there was sufficient distance between CMOS array 8 and diode 12, P substrate 14 could attenuate a sufficient amount of injected electrons such that these injected carriers would not produce a significant amount of interference with CMOS array 8 in the form of latch-up and shifts in threshold voltage. However, to increase the profitability, performance, and improve the size of IC 2, the semiconductor industry is reducing the scale of devices fabricated on IC 2. In addition, the semiconductor industry is reducing the distance between devices, such as power MOSFET 4 and CMOS array 8, on IC 2. Consequently, resistive substrate 14 is no longer sufficient to shield CMOS array 8 from injected electrons in a reduced scale IC 2.

Another structure provided in the present invention that shields CMOS array 8 from electrons injected by diode 12 is N+ ring 6. N+ ring 6 formed between power MOSFET 4 and CMOS logic 8 provides a low resistance path to ground for the injected electrons. As shown in FIG. 1, there is a ground contact to N+ ring, 6. N+ ring 6 will collect and extract a large amount of electrons injected by diode 12 from IC 2. N+ ring 6 could, if made sufficiently large, collect enough injected electrons to shield CMOS logic array 8 from latch-up or shifts in threshold voltage caused by the injected electrons. However, the semiconductor industry is seeking to reduce the size and scale of IC 2 to improve the profitability, performance, and size of IC 2. As a result, the fabrication of such a large N+ ring 6 is undesirable. Consequently, N+ ring 6 greatly aids in the shielding of CMOS array 8 from injected electrons.

A further structure provided in the present invention that shields CMOS array 8 from electrons injected by diode 12 is P+ Buried Layer (PBL) 22. PBL 22 is formed below CMOS array 8. PBL 22 is an area of high recombination for minority carriers injected by diode 12. When a negative bias is placed across diode 12, diode 12 injects electrons into P substrate 14. The injected electrons are minority carriers in P substrate 14. While some injected electrons are removed by recombination within resistive substate 14, substrate 14 does not facilitate a large enough amount of recombination to shield CMOS array 8 from the injected electrons. P+

Buried Layer 22 is formed to provide a region of high recombination with the injected minority carriers. A large amount of carriers that are not attenuated by substrate 14 or collected by N+ ring 6 are extracted from IC 2 by recombination in PBL 22.

P wells 24 are formed coupled to PBL 22 in order to provide a path of evacuation for the hole current in PBL 22. For holes propagating in PBL 22, P wells 24 provides a low resistance path to ground. Through evacuating this hole current, P wells 24 reduce the amount of electrical noise in substrate 14 and reduces the occurrence of latch-up.

An additional structure is provided in the present invention that shields CMOS array 8 from electrons injected by diode 12. This structure is N+ Buried Layer (NBL) 26, which is formed under NMOS 20. NMOS devices 20 each reside next to an N well 28 in a P well 30. NMOS devices 20 operate with a p-body. Any holes propagating through P well 30 toward NMOS 20 could greatly interfere with the operation of NMOS 20. The recombination of electrons in PBL 22 generates a hole current in PBL 22. If this current were not blocked, it would propagate into P well 30 and inhibit the operation of NMOS 20. As a result, N+ Buried Layer 24 is provided to block the propagation of holes from PBL 22 into Pwell 30. Through blocking the propagation of holes from PBL 22 into P well 30, NBL 26 reduces the amount of noise that interferes with NMOS 20 and inhibits the occurrence of latch-up. In addition, NBL 26 is formed coupled to N wells 28. N wells 28 are formed for isolating PMOS 18. As a result, NBL 26 also provides a low resistance path to extract any electrons that did not recombine in PBL 22. In this manner, NBL 26 collects and extracts the remaining injected electrons from IC 2. As a result, NBL 26 provides a final shield for CMOS array 8 from injected electrons. Together, resistive P substrate 14, N+ ring 6, PBL 22, and NBL 26 function to shield CMOS array 8 from burst of electrons coming from diode 12.

A P well 32 is formed between drain 10 of power MOSFET 4 and N ring 6 in order to separate N ring 6 from drain 10. As shown in FIG. 1, there is a ground contact to P well 32. Although P wells 24, 30, and 32 are shown with ground contacts so they are at the same potential, they could have different contacts and in such case P wells 24, 30, and 32 and N wells 28 would not necessarily be at the same potential.

FIG. 2 illustrates the flow of carriers in a prior art IC. Referring to FIG. 2, IC 34 is provided with a power MOSFET 36 and an N ring 38 and a CMOS array 40. Power MOSFET 34 includes a source 42, gate 44, and drain 46. CMOS array 40 controls the operation of power MOSFET 34. Power MOSFET 34 is used to control an external device that includes an inductive element. As discussed above with respect to Power MOSFET 4, switching power MOSFET 34 OFF creates a back EMF in the external inductive element. This back EMF produces a negative voltage across the external inductive device. Referring again to FIG. 2, this negative voltage across the external inductive element creates a negative bias on drain 46 of power MOSFET 34. Drain 46 of power MOSFET 34 forms a PN junction diode 48 with P substrate 50. This negative voltage across diode 48 causes diode 4 to inject a burst of electrons into substrate 50 of IC 34.

The burst of electrons injected into substrate 50 propagate through substrate 50 along path 52 toward N ring 38 and CMOS array 40. A majority of these electrons are extracted by N ring 38. When the remainder of these electrons propagate along path 54 and reach CMOS array 40, they cause shifts in the threshold voltages of the devices forming CMOS array 40. In addition, these electrons also cause latch-up to occur amongst the CMOS devices in array 40.

FIG. 3 illustrates a flow of carriers in a preferred embodiment of the present invention. Referring to FIG. 3, IC 2 is provided with a power MOSFET 4 and a CMOS array 8. Power MOSFET 4 includes drain 10. CMOS array 8 controls the operation of power MOSFET 4. Power MOSFET 4 is used to control an external device that includes an inductive element. As discussed above, switching power MOSFET 4 OFF creates a back EMF in the external inductive element. This back EMF produces a negative voltage across the external inductive device. Referring again to FIG. 3, this negative voltage across the external inductive element creates a negative bias on drain 10 of power MOSFET 4. Drain 10 of power MOSFET 4 forms PN junction diode 12 with P substrate 14. This negative voltage on drain 10 places diode 12 in forward bias, thereby causing diode 12 to inject a burst of electrons into substrate 14 of IC 2.

A majority of carriers injected by diode 12 follow path 56 toward N+ ring 6. These carriers that follow path 56 are collected and extracted from IC 2 by N+ ring 6. The remainder of these injected carriers propagate through substrate 14 along path 58 toward CMOS array 8. These carriers encounter PBL 22 prior to reaching CMOS array 8. A majority of the carriers propagating along path 58 recombine in PBL 22. This recombination of carriers in PBL 22 leads to the generation of a hole current in PBL 22. This hole current is removed from chip 2 through P wells 24 along path 60. NBL 26 blocks this propagation of this hole current into P well 30 where it would interfere with the operation of NMOS device 20. In addition, note that a small number of the electrons propagating along path 58 do not recombine in PBL 22 and continue propagating toward CMOS array 8. These carriers also encounter NBL 26. Again, as discussed above, NBL 26 is a low resistance path to extract the injected electrons through N well 28. As a result, CMOS array 8 is then shielded from the burst of electrons injected by diode 12.

Referring again to FIG. 3, the occurrence of electron injection from diode 12 forms a parasitic BJT in IC 2. Drain 10 of power MOSFET 4 acts as the emitter of the parasitic BJT during inductive switching. N+ ring 6 and each N well 28 act as the collector of the parasitic BJT. Substrate 14 functions as the base of the parasitic BJT. During an electron burst due to inductive switching, drain 10 injects electrons into substrate 14. A majority of these carriers are extracted through N+ ring 6. The remainder of the electrons are then recombined in PBL 22.

Figure 4:
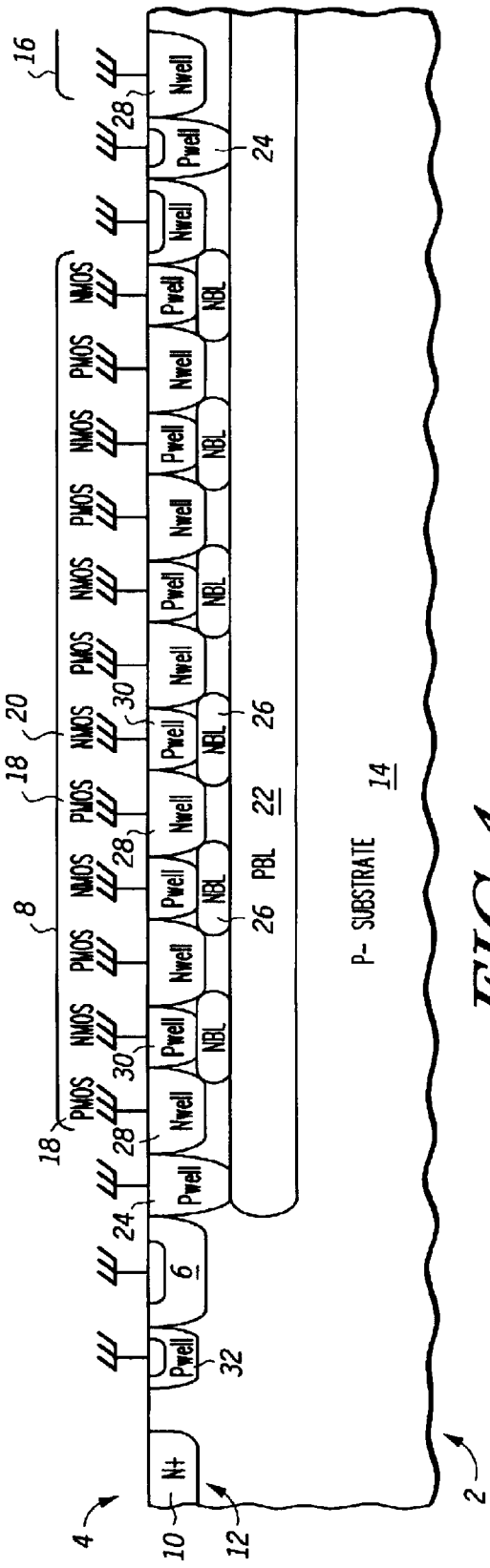
FIG. 4 illustrates a close up view of an alternative CMOS array configuration fabricated on a preferred embodiment of the present invention.

FIG. 4 illustrates a close up view of an alternative CMOS array configuration fabricated an a preferred embodiment of the present invention. In FIGS. 1 and 3, CMOS array 8 isolated between P wells 24 is depicted having three CMOS devices, each having an NMOS 20 and PMOS 18. However, this number of CMOS devices is merely illustrative. For instance, in FIG. 4, an alternative embodiment is shown having six CMOS devices fabricated in CMOS array 8. The guiding factor in determining how many CMOS devices rest within each CMOS array 8 is determined by the circuit layout.

It is possible to form PBL 22 and NBL 26 using an implant process. Alternatively, it is possible to form PBL 22 and NBL 26 through a bonding process. In a bonding process, two dissimilar wafers are bonded. Then these wafers are etched back to the desired configuration.

Through using resistive substrate 14, N+ ring 6, PBL 22 and NBL 26, it is possible to reduce the scale of IC 2 and bring power MOSFET 4 and CMOS array 8 closer together. As a result, IC 2 becomes smaller, faster, and can support more and larger applications. Further, the cost of IC 2 is reduced as it is scaled down in size.

Referring again to FIGS. 1, 3, and 4, a preferred embodiment is illustrated having a P substrate 14, N+ ring 6, P+ Buried Layer 22, and an N+ Buried Layer 26. It is also desirable to fabricate IC 2 with an N substrate 14, P+ ring 6, N+ Buried Layer 22, and a P+ Buried Layer 26.

Although the present invention has been described in detail, it will be apparent to those of skill in the art that the invention may be embodied in a variety of specific forms and that various changes, substitutions, and alterations can be made without departing from the spirit and scope of the invention. The described embodiments are only illustrative and not restrictive and the scope of the invention is, therefore, indicated by the following claims.

We claim:

1. An integrated circuit, comprised of:
    a resistive substrate of a first conductivity type;
    a power transistor formed on said substrate;
    a digital logic array formed on said substrate next to said power transistor;
    a low resistivity ring formed on said substrate between said power transistor and said digital logic array;
    a buried layer of the first conductivity type formed in said substrate below said digital logic array; and
    a low resistivity layer of a second conductivity type formed in said substrate between said buried layer and said digital logic array.

2. The integrated circuit of claim 1, wherein said digital logic array is comprised of a plurality of first transistors.

3. The integrated circuit of claim 2, further comprised of a ground contact to said low resistivity ring.

4. An integrated circuit comprised of:
    a resistive substrate;
    a power transistor formed on said substrate, wherein said power transistor includes a drain;
    a digital logic array formed on said substrate next to said power transistor;
    low resistivity means to collect minority carriers injected by said drain into said substrate, wherein said low resistivity means is formed on said substrate between said power transistor and said digital logic array; and
    recombination means to reduce the amount of minority carriers injected by said drain into said substrate, said recombination means formed in said substrate below said digital logic array;
    minority carrier collection means to extract minority carriers from said substrate, said minority carrier collection means formed in said substrate between said recombination means and said digital logic array.

5. The integrated circuit of claim 4, wherein said digital logic array is comprised of a plurality of first transistors.

6. The integrated circuit of claim 5, further comprised of a ground contact to said low resistivity means.

7. A process for shielding a logic array from minority carrier injection into a substrate comprising the steps of:
    attenuating said injected minority carriers with a resistive substrate;
    collecting said injected minority carriers with a low resistivity ring formed in said resistive substrate;
    recombining said injected minority carriers with a region of high majority carrier concentration formed in said substrate under said logic array; and
    extracting said injected minority carriers from said substrate with a low resistivity region formed under said logic array.

8. The process of claim 7, further comprising the step of extracting said injected minority carriers from said substrate with a transistor coupled to said low resistivity region formed under said logic array.

9. The process of claim 8, further comprising the step of isolating said low resistivity ring from said logic array with a ground contact.

10. The process of claim 9, further comprising the step of isolating said low resistivity ring from a power transistor with a ground contact.

11. A structure for protecting a logic array from a substrate minority carrier injection caused by inductive switching of a power device, comprised of:
    a substrate;
    a ring formed on said substrate, wherein said ring forms a low resistance path to ground for said minority carriers;
    a buried layer forms a region of high minority carrier recombination, wherein said buried layer formed in said substrate under said logic array;
    a low resistance buried region, said low resistance buried region provides a low resistance path to ground for minority carriers, said low resistance buried region formed under said logic array above said buried layer.

12. The structure of claim 11, wherein said logic array is comprised of a plurality of transistors.

13. The integrated circuit of claim 12, further comprised of a ground contact to said ring.

* * * * *